US00RE35642E

United States Patent [19]

Frisina et al.

[11] E Patent Number: Re. 35,642

[45] Reissued Date of Patent: Oct. 28, 1997

[54] INTEGRATED HIGH-VOLTAGE BIPOLAR POWER TRANSISTOR AND LOW VOLTAGE MOS POWER TRANSISTOR STRUCTURE IN THE EMITTER SWITCHING CONFIGURATION AND RELATIVE MANUFACTURING PROCESS

[75] Inventors: Ferruccio Frisina, Sant' Agata li Battiati; Giuseppe Ferla, Catania, both of Italy

[73] Assignee: SGS-Thomson Microelectronics, S.r.l., Agrate Brianza, Italy

[21] Appl. No.: 447,184

[22] Filed: May 22, 1995

Related U.S. Patent Documents

Reissue of:

[64] Patent No.: 5,065,213
Issued: Nov. 12, 1991
Appl. No.: 288,405
Filed: Dec. 21, 1988

U.S. Applications:

[63] Continuation of Ser. No. 152,959, Nov. 12, 1993, abandoned.

[30] Foreign Application Priority Data

Dec. 22, 1987 [IT] Italy ..... 6631 A/87

[51] Int. Cl.[6] ..... H01L 29/76

[52] U.S. Cl. ..... 257/327; 257/328; 257/335; 257/341; 257/378; 257/401; 257/408; 257/566; 257/577; 257/591; 257/592

[58] Field of Search ..... 257/327, 328, 257/341, 335, 378, 401, 408, 566, 577, 591, 592

[56] References Cited

U.S. PATENT DOCUMENTS

| | | |
|---|---|---|
| T892,019 | 11/1971 | Sack . |
| 3,544,863 | 12/1970 | Price et al. . |
| 3,880,676 | 4/1975 | Douglas et al. . |
| 4,120,707 | 10/1978 | Beasom . |
| 4,151,006 | 4/1979 | De Graaff et al. . |
| 4,210,925 | 7/1980 | Morcom et al. . |
| 4,277,794 | 7/1981 | Nuzillat . |
| 4,311,532 | 1/1982 | Taylor . |
| 4,458,408 | 7/1984 | Alonas et al. . |
| 4,483,738 | 11/1984 | Blossfeld . |
| 4,523,215 | 6/1985 | Iwatani . |
| 4,667,393 | 5/1987 | Ferla et al. . |
| 4,721,684 | 1/1988 | Musumeci . |
| 4,814,288 | 3/1989 | Kimura et al. . |
| 4,879,584 | 11/1989 | Takagi et al. . |

(List continued on next page.)

FOREIGN PATENT DOCUMENTS

| | | | |
|---|---|---|---|
| 322 040 | 6/1989 | European Pat. Off. . | |
| 322 041 | 6/1989 | European Pat. Off. . | |
| 347 550 | 12/1989 | European Pat. Off. . | |
| 83/00407 | 2/1983 | WIPO | 257/327 |

OTHER PUBLICATIONS

Blanchard, "A Power Transistor With an Integrated Thermal Feedback Mechanism," Master of Science Dissertation (1970). Jul.

*Primary Examiner*—Edward Wojciechowicz
*Attorney, Agent, or Firm*—Robert Groover; Betty Formby

[57] ABSTRACT

A description is given of two versions of an integrated structure in the emitter switching configuration comprising a high-voltage bipolar power transistor on a low-voltage MOS power transistor. In the vertical MOS version, the emitter region of the bipolar transistor is completely buried, partly in a first N–epitaxial layer and partly in a second N epitaxial layer; the MOS is located above the emitter region. The bipolar is thus completely buried active sturcture. In the horizontal MOS version, in a N–epitaxial layer there are two P+regions, the tint, which constitutes the base of the bipolar transistor, receives the N+emitter region of the same transistor; the second receives two N+regions which constitute the MOS source and drain regions, respectively; the front of the chip is provided with metal plating to ensure the connection between the MOS drain and the bipolar emitter contacts.

9 Claims, 4 Drawing Sheets

U.S. PATENT DOCUMENTS 4,881,119 11/1989 Paxman et al. .
4,892,836 1/1990 Andreini et al. .
4,898,836 2/1990 Zambrano et al. .
4,935,799 6/1990 Mori et al. .
4,947,231 8/1990 Palara et al. .
4,969,030 11/1990 Musumeci et al. .
5,065,213 11/1991 Frisina et al. .
5,118,635 6/1992 Frisina et al. .
5,119,161 6/1992 Zambrano et al. .

INTEGRATED HIGH-VOLTAGE BIPOLAR POWER TRANSISTOR AND LOW VOLTAGE MOS POWER TRANSISTOR STRUCTURE IN THE EMITTER SWITCHING CONFIGURATION AND RELATIVE MANUFACTURING PROCESS

Matter enclosed in heavy brackets [ ] appears in the original patent but forms no part of this reissue specification; matter printed in italics indicates the additions made by reissue.

*This is a continuation of application Ser. No. 08/152,959, filed Nov. 12, 1993 now abandoned, which is a Reissue of 07/288,405 filed Dec. 21, 1988, now U.S. Pat. No. 5,065, 213.*

FIELD OF THE INVENTION

This invention relates to an integrated high-voltage bipolar power transistor and low-voltage MOS power transistor structure in an emitter switiching configuration and to a manufacturing process therefore.

BACKGROUND OF THE INVENTION

Emitter switching is a circuit configuration in which a low-voltage power transistor (typically an MOS transistor) cuts off the emitter current of a high-voltage power transistor (typically a bipolar transistor) in order to switch it off. This configuration, which up until now was obtained by means of discrete components, offers the following advantages:

it increases the strength of bipolar transistor as far as the possibility of inverted secondary ruptures (ESB) occurring are concerned;

it combines the current and voltage carrying capacity of a piloted transistor and the high speed of a low-voltage transistor; and it enables the system to be piloted directly with linear logic circuits, through the MOS gate.

OBJECT OF THE INVENTION

In view of the advantages that an integrated circuit generally offers, as compared to an analog circuit obtained by means of discrete components, the object of this invention is to provide a high-voltage bipolar power transistor and a low-voltage MOS power transistor, connected together in the emitter switching configuration, and integrated in a single chip of semiconductor material.

SUMMARY OF THE INVENTION

The integrated high-voltage bipolar power transistor and vertical low-voltage MOS power transistor structure, in the emitter switching configuration of the invention comprises:

an N+ type semiconductor substrate, an overlying semiconductor layer, a first P type region buried in the aforesaid layer, a second P type region connecting the first aforesaid region on the surface, the first and second region constituting the base region of the bipolar transistor, and a third N+ type region adjoining the aforesaid first region from below and constituting the emitter region of the bipolar transistor.

According to the invention the semiconductor layer consists of a first N-type epitaxial layer and a second N-type epitaxial layer grown on it, the first region is located in the first epitaxial layer, in the vicinity of the surface adjacent to the second epitaxial layer, and the second region is located in the second epitaxial layer. The third region can consist of a completely buried layer located astride between the boundary of the first and second epitaxial layer, the body and source regions of the MOS can be located in the second epitaxial layer, in the vicinity of its surface and above the third region. The drain region of the MOS consists substantially of the region between the third region and the aforesaid body regions. Alternatively an integrated high-voltage bipolar power transistor and horizontal low-voltage MOS power transistor structure, in the emitter switching configuration comprises:

an N+ type semiconductor substrate, an N− type expitaxial layer grown on the substrate, a first P+ type region, constituting the base of the bipolar transistor, located in the layer in the vicinity of its surface, and a second N+ type region, constituting the emitter of the bipolar transistor, adjoining the aforesaid first region from below and from the side and adjoining the surface of the layer from above. According to the invention in the N− type epitaxial layer and in the vicinity of its surface there is a third P+ conductivity region as well as a fourth and a fifth N+ type region. These latter regions constitute the MOS source and gate regions respectively and being adjacent from below and from the side to the aforesaid third region. The metal coatings of the MOS transistor drain and of the bipolar transistor emitter are interconnected by means of tracks of conductor material.

A process for manufacturing an integrated high-voltage bipolar power transistor and vertical low-voltage MOS power transistor structure, in the emitter switching configuration is characterized by the fact that:

a second N conductivity epitaxial layer, designed to constitute the drain region of the MOS transistor and at the same time automatically form the connection between the drain of the MOS transistor and the emitter of the bipolar transistor, is grown on the first epitaxial layer, the body, the source and the gate of the MOS transistor are then created in the second epitaxial layer, by means of the known processes, in correspondence with the aforesaid buried emitter zone of the bipolar transistor, and a P+ type region, which enables the base region of the bipolar transistor to be electrically connected on the surface, is also created at the side of said MOS transistor, by means of the known techniques of oxidation, photomasking, implantation and diffusion.

Alternatively, the process is characterized in that:

a second P+ type region, separated from the first by a region of the epitaxial layer, is created in the epitaxial layer simultaneously to said first region, a fourth and a fifth N+ type region, designed to constitute the MOS source and drain region respectively, are created within the second region, and the deposition of tracks of conductor material designed to electrically interconnect the emitter and drain metal coatings is carried out simultaneously to the deposition of the films of conductor material designed to form the gate terminals and the metal coatings which ensure the ohmic contact with the MOS source and drain regions and with the base and emitter regions of the bipolar transistor.

BRIEF DESCRIPTION OF THE DRAWING

The above and other objects, features and advantages of my invention will become more readily apparent from the following description, reference being made to the accompanying highly diagrammatic drawing in which.

SPECIFIC DESCRIPTION

Figure 1:
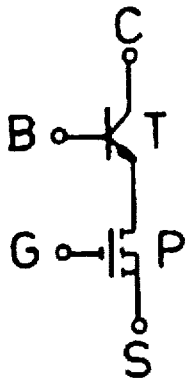
FIG. 1 is a circuit diagram which shows the equivalent electrical circuit of the 4-terminals integrated structures, which the invention intends to realize.

FIG. 1 shows the equivalent electrical circuit of the 4-terminal integrated structures that the invention intends to provide.

This circuit consists or a high-voltage bipolar power transistor T connected by means of its emitter to the drain of a low-voltage MOS power transistor P.

The various stages of the manufacturing process of the integrated structure, in the vertical MOS version, are described hereunder.

Figure 2:
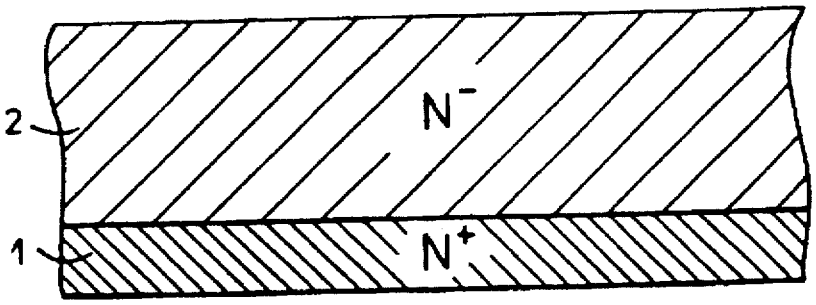
FIGS. 2–7 are diagrammatic sections which show a structure according to the invention, in the vertical MOS power transistor version, during the various stages of the manufacturing process.
Figure 3:
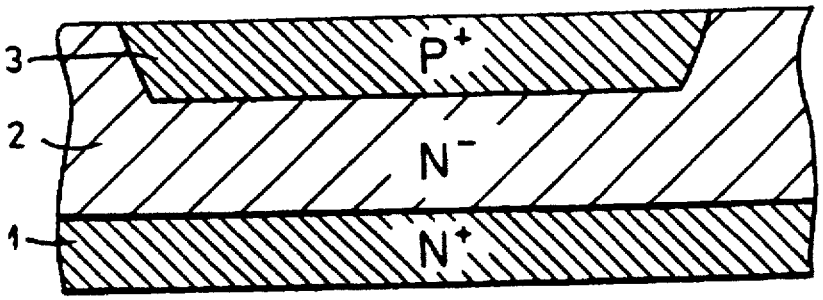
Figure 4:
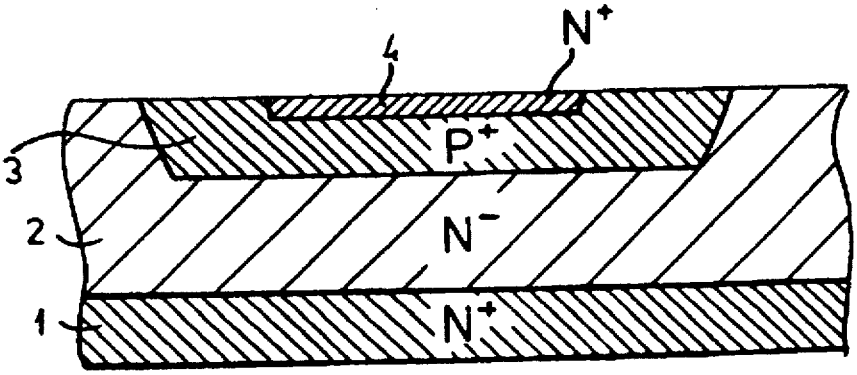
Figure 5:
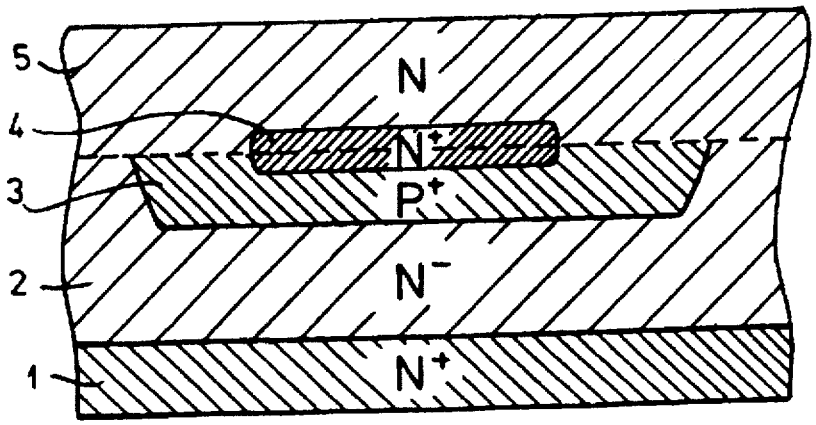
Figure 6:
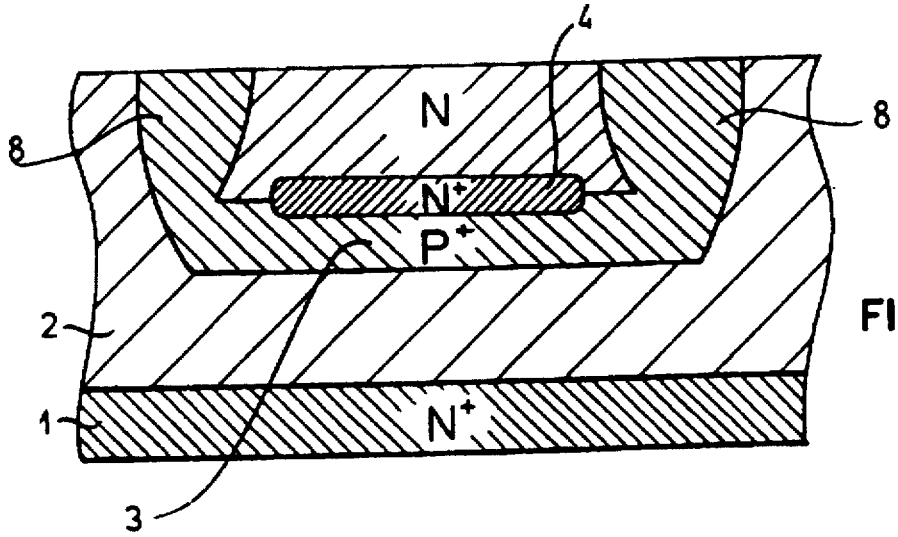

A first high resistivity N- conductivity epitaxial layer 2 is grown on an N+ type substrate 1 (FIG. 2). A P+ type region 3 is then obtained, by deposition or implantation and subsequent diffusion, on said layer 2 (FIG. 3). An N+ type region 4 is then obtained by means of the same process (FIG. 4). This is followed by the growth of a second N type epitaxial layer 5 (FIG. 5) and, by the known procedures of oxidation, photomasking, implantation and diffusion, the creation of the P+ type regions 8, which enable the region 3 constituting the base of the bipolar transistor to be connected on the surface (FIG. 6). A low-voltage vertical MOS power transistor and in particular the relative P conductivity body regions 6, N+ type source regions 7 (FIG. 7), the gate 9 and the metal coatings 10, 11 and 14 for ensuring the ohmic contact with the regions 6, 7, 8 and the substrate 1 (FIG. 8) are then created in the area between the two regions 8, according to known procedures.

Figure 8:
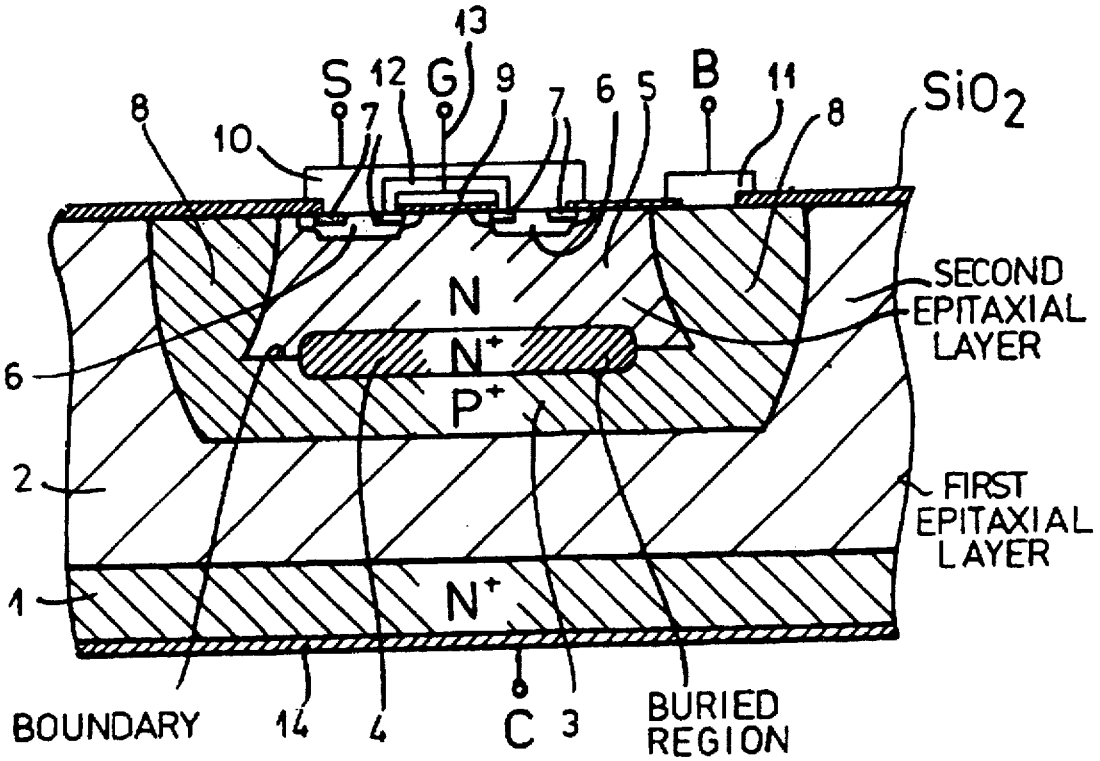
FIG. 8 is a section which shows the structure obtained at the end of the process referred to in the previous FIGS. 2–7.

FIG. 8 shows the final structure, as it appears after addition of the terminals C (collector), B (base), S (source) and G (gate) and the insulating layer 12 of the gate 9 (said gate being connected to the relative terminal by means of the insulated conductor 13). Regions 1, 2, 3 and 4 of the figure constitute, respectively, the collector, the base and the emitter of a bipolar transistor, while region 5 constitutes the drain of the MOS. Said drain is consequently connected directly to the emitter of the bipolar transistor thus forming a structure having as its equivalent circuit the circuit of FIG. 1.

The emitter 4 represents a completely buried N+ type active region; by growing a second N type epitaxial layer 5 it is thus possible to connect the drain of the MOS to the emitter 4 of the bipolar transistor.

Figure 7:
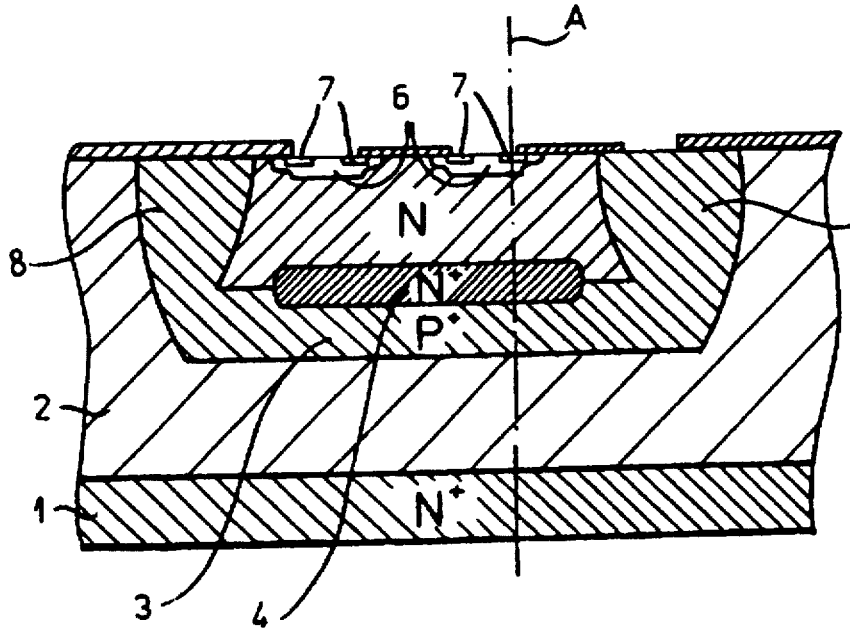
Figure 9:
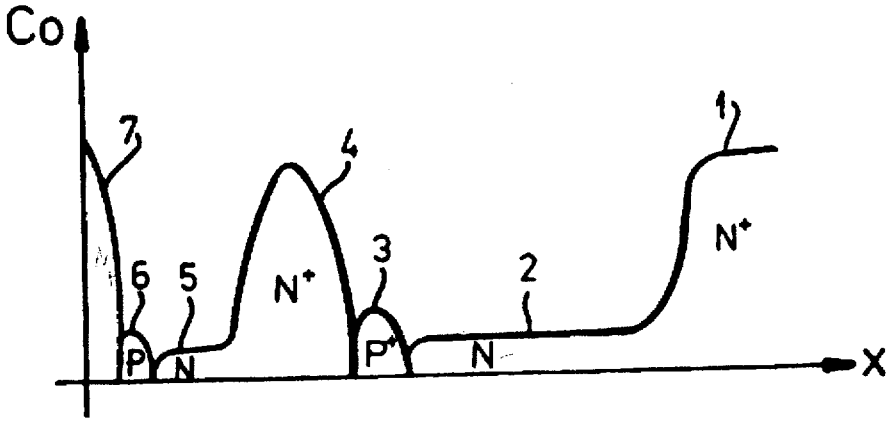
FIG. 9 is a shows a diagram of the concentrations of the various types of doping agent along a section of the structure of FIG. 7.

The profile of the concentration (Co) of the various types of doping agent in the different regions of the structure, along section A—A of FIG. 7, is shown in FIG. 9, where axis x refers to the distance from the upper surface of the structure.

The manufacturing process of the integrated structure, in the horizontal MOS power transistor version, includes the following stages.

Figure 10:
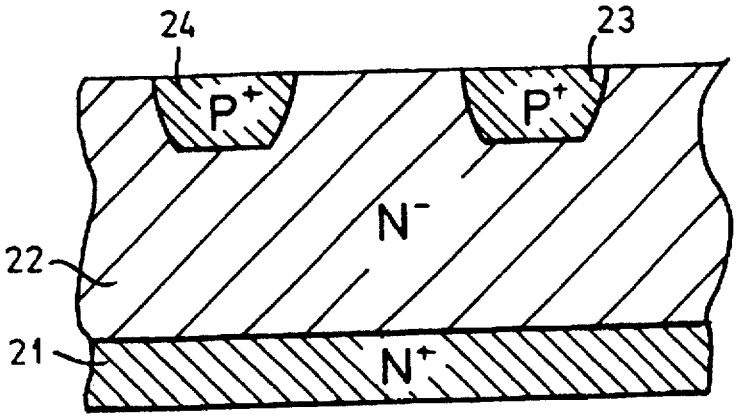
FIGS. 10–11 are sections which show a structure according to the invention, in the horizontal MOS power transistor version, during the various stages of the manufacturing process.
Figure 11:
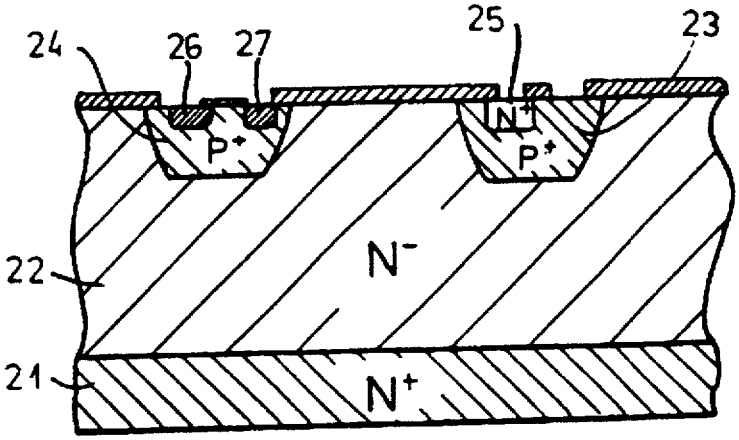
Figure 12:
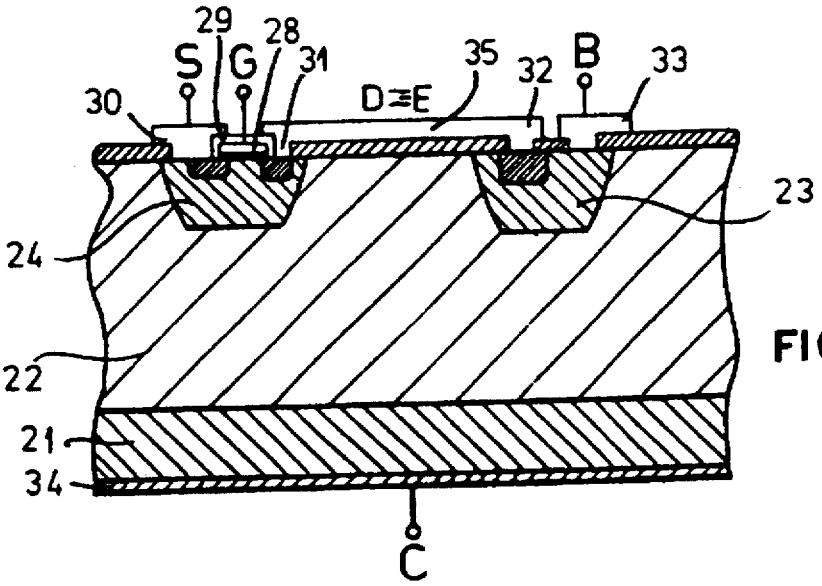
FIG. 12 is a section which shows a schematic representation of the structure obtained at the end of the process referred to in FIGS. 10–11.

A high resistivity N– type epitaxial layer 22, which is designed to constitute the collector of the bipolar transistor, is grown on a N+ type substrate 21 (FIG. 10). Two P+ type regions 23 and 24 are then created simultaneously on said layer, by the known processes of deposition or implantation and subsequent diffusion, the first of which being destined to act as a base for the bipolar transistor and the second to receive the MOS. By means of the known processes of oxidation, photomasking, deposition or implantation and subsequent diffusion, an N+ type region 25 which is destined to act as the emitter of the bipolar transistor is created within the region 23, while two N+ type regions 26 and 27 which are destined to act as the source and the drain of the MOS are created within the region 24 (FIG. 11). This is followed by the formation of the MOS gate 28, the gate insulating layer 29, the metal coatings 30, 31, 32, 33 and 34, which are designed to ensure the ohmic contact with the underlying regions, and lastly the connections to the terminals S, G, B and C (FIG. 12).

The aforesaid metal coatings also include the formation of a track 35 for connecting the drain D to the emitter E, so as to achieve the connection of the two transistors in the configuration of FIG. 1.

In both the vertical MOS and horizontal versions, the final structure obtained is provided with 4 terminals, 3 of said terminals being located on one face of the chip and the 4th on the other face.

The described process can obviously be used to simultaneously obtain, on the same chip, several pairs of bipolar and MOS transistors having a collector terminal in common and their base contacts, sources and gates connected to three respective common terminals by means of a metal coating carried out on the front of the chip at the end of the process.

We claim:

1. An integrated high-voltage bipolar power transistor and vertical low-voltage MOS power transistor structure, comprising:

an N+ type semiconductor substrate;

an overlying semiconductor layer on said N+ type semiconductor substrate and comprising a first N type epitaxial layer and a second N type epitaxial layer grown on said first N type epitaxial layer;

a first dopant-diffusion P type region formed in said first N type epitaxial layer in a vicinity of a boundary between said first N type epitaxial layer and said second N type epitaxial layer;

a second P type region connecting said first P type region with a surface of the structure and located in said second N type epitaxial layer, said first and second regions constituting a base region of a bipolar transistor of said structure;

a third completely buried N+ type region adjoining at a lower side said first P type region, substantially more doped than said second epitaxial layer, located astride said boundary between said first and second epitaxial layers, and constituting an emitter region of the bipolar transistor, a portion of said second epitaxial layer being disposed between said third region and said surface with said second region extending alongside said portion of said second epitaxial layer to said surface;

body and source regions of an MOS transistor of said structure located in said portion of said second epitaxial layer in a vicinity of said surface and above said third region spaced from said second P type region;

means connected to said portion of said epitaxial layer between said body and source regions to form from said portion a drain region of said MOS transistor; and means connected to said N+ type semiconductor substrate to form from said substrate a collector of said bipolar transistor.

2. An integrated high-voltage bipolar power transistor and horizontal low-voltage MOS power transistor structure in an emitter switching configuration, comprising:

an N+ type semiconductor substrate;

an N− type epitaxial layer grown on said N+ type semiconductor substrate;

a first dopant-diffusion P+ type region formed in said N− type epitaxial layer at a surface thereof and constituting a base of a bipolar transistor of said structure;

a second N+ type region formed within said first P+ type region and adjoining said first P+ type region at a bottom and sides of said second N+ type region and terminating at said surface to constitute an emitter of said bipolar transistor;

a third P+ type region formed in said N− type epitaxial layer at said surface, spaced from said first P+ type region;

a fourth N+ type region formed within said third P+ type region and adjoining said third P+ type region at a bottom and sides of said fourth N+ type region and terminating at said surface, said fourth N+ type region forming a source of an MOS transistor of said structure;

a fifth N+ type region formed within said third P+ type region and adjoining said third P+ type region at a bottom and sides of said fifth N+ type region and terminating at said surface, said fifth N+ type region being spaced from said fourth N+ type region and forming a drain of said MOS transistor of said structure;

a conductor track on said surface connecting said emitter and said drain; and means connected to said N+ type semiconductor substrate to form from said substrate a collector of said bipolar transistor.

*3. An integrated circuit device structure, comprising, in a substantially monocrystalline body of semiconductor between first and second surfaces thereof:*

*a collector, extending to said first surface, which is heavily doped with a first conductivity type;*

*a drift region, overlying said collector, which has said first conductivity type and is more lightly doped than said collector;*

*a base region, overlying said drift region, which has a second conductivity type;*

*an emitter region, overlying said base region, which is heavily doped with said first conductivity type;*

*a drain region, overlying said emitter region, which has said first conductivity type and is more lightly doped than said emitter region;*

*a body region, overlying said drain region, which has said second conductivity type;*

*a source region, overlying said body region, which is heavily doped with said first conductivity type;*

*a gate electrode which is in proximity to said second surface of said monocrystalline body, and which is capacitively coupled to said body region to induce therein a channel region which provides a current path from said source region and said drain region.*

*4. The device structure of claim 3, wherein said first conductivity type is N-type and said second conductivity type is P-type.*

*5. The device structure of claim 3, wherein said gate electrode is insulated from said body region.*

*6. An integrated circuit device structure, comprising, in a substantially monocrystalline body of semiconductor between first and second surfaces thereof;*

*a VDMOS device, comprising a respective first diffusion of a first conductivity type in proximity to said first surface of said monocrystalline body, and a second diffusion of a first conductivity type within said body, and a gate electrode capacitively coupled to regulate current flow between said first and second diffusions;*

*a high-voltage bipolar device, comprising a respective first diffusion of a first conductivity type in proximity to said second surface of said monocrystalline body, and a second diffusion of a first conductivity type within said body, and a base electrode interposed to regulate current flow between said first and second diffusions;*

*wherein said VDMOS device directly overlies said bipolar device, and*

*wherein said second diffusion of said VDMOS device is merged with said second diffusion of said bipolar device.*

*7. The device structure of claim 6, wherein said first conductivity type is N-type and a second conductivity type is P-type.*

*8. The device structure of claim 6, wherein said gate electrode is insulated from said body region.*

*9. A merged power transistor structure comprising:*

*a first active device located near a first surface of a monolithic semiconductor body, and providing conduction between said first surface and a first buried layer of a first conductivity type, whose potential is controlled by said conduction of said first active device; and*

*a second active device located within said monolithic body beneath said first device, and providing bipolar conduction between said first buried layer and a second surface of the monolithic body; said second active device including a second buried layer, beneath said first buried layer, which forms a base-emitter junction with said first layer; conduction of said first device controlling the bias of said base-emitter junction, and thereby controlling conduction of said second active device;*

*whereby said first active device provides control of current, and said second active device provides high-voltage standoff with low on-resistance.*

* * * * *